United States Patent
McLaughlin et al.

(10) Patent No.: US 6,465,728 B1
(45) Date of Patent: Oct. 15, 2002

(54) SPRING CLIP FOR ELECTRONIC DEVICE AND HEAT SINK ASSEMBLY

(75) Inventors: Steven R. McLaughlin, Milwaukee, WI (US); Jeffrey R. Annis, Waukesha, WI (US); Jeroen Valensa, New Berlin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/438,111

(22) Filed: Nov. 10, 1999

Related U.S. Application Data

(63) Continuation of application No. 09/036,888, filed on Mar. 6, 1998, now abandoned.

(51) Int. Cl.⁷ .............................. H01L 23/26; H05K 7/20
(52) U.S. Cl. ........................ 174/16.3; 361/707; 257/719
(58) Field of Search .......................... 174/16.3; 361/704, 361/707, 710, 715, 690; 257/719, 720, 726, 727

(56) References Cited

U.S. PATENT DOCUMENTS

| | | | | |
|---|---|---|---|---|
| 4,004,195 A | * | 1/1977 | Harayda et al. | 317/100 |
| 4,235,285 A | * | 11/1980 | Johnson et al. | 165/80 B |
| 4,563,725 A | * | 1/1986 | Kirby | 361/388 |
| 4,575,038 A | * | 3/1986 | Moore | 248/505 |
| 4,872,089 A | * | 10/1989 | Ocken et al. | 361/388 |
| 4,933,746 A | * | 6/1990 | King | 357/81 |
| 5,040,096 A | * | 8/1991 | Churchill et al. | 361/386 |
| 5,170,325 A | * | 12/1992 | Bentz et al. | 361/388 |
| 5,179,506 A | * | 1/1993 | Corbett et al. | 361/417 |
| 5,201,866 A | * | 4/1993 | Mok | 165/80.3 |
| 5,208,731 A | * | 5/1993 | Blomquist | 361/386 |
| 5,225,965 A | * | 7/1993 | Bailey et al. | 361/386 |
| 5,237,485 A | * | 8/1993 | de Martis et al. | 361/712 |
| 5,450,284 A | * | 9/1995 | Wekell | 361/710 |

* cited by examiner

*Primary Examiner*—Dean A. Reichard
*Assistant Examiner*—William H. Mayo, III
(74) *Attorney, Agent, or Firm*—Michael A. Jaskolski; Alexander M. Gerasimow; William R. Walbrun

(57) ABSTRACT

An electronic device/heat sink assembly having at least first and second heat generating electronic devices, a heat sink member, a resilient integral spring clip, the clip including a base member and first and second oppositely facing resilient leg members extending from opposite ends of the base member, the heat sink member having oppositely facing first and second surfaces, a separate one of the electronic devices positioned on each of the first and second sink surfaces, the clip dimensioned and positioned such that the leg members sandwich the devices and heat sink therebetween.

15 Claims, 3 Drawing Sheets

SPRING CLIP FOR ELECTRONIC DEVICE AND HEAT SINK ASSEMBLY

CROSS-REFERENCE TO RELATED APPLICATIONS

This application is a continuation of U.S. patent application Ser. No. 09/036,888 that was filed on Mar. 6, 1998 having the same tile and which is now abandoned.

STATEMENT REGARDING FEDERALLY SPONSORED RESEARCH OR DEVELOPMENT

Not applicable.

BACKGROUND OF THE INVENTION

The present invention relates to semiconductor heat dissipation and more particularly to a spring clip for securing heat sinks to electronic devices (e.g. TO-218, TO-247, TO-264, TO-3P, TO-3PL, etc.) and a unique inverter/converter power device configuration.

Semiconductor switching devices generate heat which must be dissipated to maintain device integrity. One way to dissipate device heat is to provide heat sinks. A sink typically includes a thermally conductive material attached to a device. To increase dissipation efficiency, most sinks include a plurality of dissipation fins or apertures which increase the amount of sink surface area exposed to the ambient (i.e. increase radiation area). In addition, most devices include a primary heat dissipating surface (i.e. a baseplate) which is securable to the sink to facilitate efficient heat flow.

Some mechanisms for securing a semiconductor switching device to a sink include a simple screw (see U.S. Pat. No. 5,592,021, FIG. 1, Prior Art), a clamp and screw (see U.S. Pat. No. 4,259,685), or a clamp integrally attached to a sink (see U.S. Pat. No. 5,068,764). Unfortunately, while these mechanisms, when properly employed, can prevent device overheating, they have a number of shortcomings.

For example, some of these mechanisms provide uneven pressure on the semiconductor devices causing the primary heat dissipating surface to buckle whereby a portion of the dissipating surface is raised away from the sink. This separation results in a significant reduction in reliability and increases heat transfer resistance, thereby reducing dissipation effectiveness.

In addition, these mechanisms can cause what is referred to as "voltage creep". Because sinks have to be thermally conductive, most sinks are metallic. When a device is connected directly to a metallic sink, in addition to making thermal contact, the sink and device make electrical contact. When any connected metallic components are at different potentials, the potential "creeps" along the metallic surfaces and can cause unintended and undesirable voltage stresses or electrical shorting in the sink and switching devices, hence the phrase "voltage creep".

Moreover, device/sink configurations often require a large amount of space. This is particularly true in applications which require a large number of switching devices. One such application is a converter/inverter for changing AC to DC voltage and DC to AC voltage. As well known in the art, at a minimum, six separate switching devices are required to efficiently convert DC to AC voltage and another six devices are required to rectify AC voltage and provide DC voltage (assuming a standard three phase system). Space is often saved by providing the rectifying devices in a single integrated in-line package (SIP). Nevertheless, the SIP, like the DC to AC devices, generates an appreciable amount of heat which must be dissipated. Because dissipation effectiveness typically increases with exposed sink surface area, large and/or separate sinks are often provided for each power device and another for the SIP, resulting in a configuration which requires a substantial amount of space.

One other problem with conventional securing mechanisms, is that a relatively large number of components are required to secure devices to sinks. As evidenced by the art cited above, typical securing mechanisms may include a plurality of mechanical components (e.g. clamps, screws, etc.) for connecting each device to an associated sink. Extra components increase hardware costs and assembly time.

The industry has recognized and attempted to address at least some of the problems identified above. For example, to eliminate or reduce voltage creep, a thermally conductive, electrically insulative and mechanically separating layer of material is often positioned between the primary heat dissipating surface of a semiconductor device and a heat sink. In this manner, heat is dissipated but voltage is blocked.

One solution which addresses many of the problems described above is disclosed in U.S. Pat. No. 5,450,284 which issued on Sep. 12, 1995. The assembly described therein uses a single clamping device bolted to a single heat sink to secure a plurality (i.e. 4) of semiconductor devices to the sink. The devices are separated from the sink by two separate thermally conductive and electrically insulating insulators which eliminate voltage creep.

While this solution reduces the overall mechanical parts count, eliminates voltage creep, provides even pressure on each device thereby eliminating device buckling and reduces overall device/sink space, this solution still has several shortcomings. First, this solution still requires several securing components and most of the components are relatively complex. For example, the clamp requires a separate retaining finger for each device secured to the sink and all components require a number of precisely located apertures. Second, this solution is difficult to assemble (e.g. has many different apertures and elements which must be precisely aligned). Third, this solution requires an elongated, relatively large space to accommodate a plurality of separate switching devices. For example, in order to configure an inverter/converter with this solution, all six required switching devices and the SIP would have to be placed next to each other in a single row on a single sink. While such a configuration might be possible, the sink length required to accommodate so many devices in a single row would render the assembly to large for many applications. In the alternative, two or more separate assemblies including a separate sink for each assembly could be configured according to this solution and the separate assemblies could be positioned in parallel to provide inverter/converter power devices. This, however, would increase the parts count and also the space required to house the power components.

Therefore, it would be advantageous to have an apparatus for inexpensively and easily securing a heat sink to a semiconductor switching device and, in addition, it would be particularly advantageous to have such an apparatus for securing together inverter/converter power components so as to efficiently dissipate heat, eliminate voltage creep and require minimal space.

BRIEF SUMMARY OF THE INVENTION

The present invention includes a resilient spring clip for coupling a semiconductor switching device to a heat sink. The clip is formed of stainless steel and includes a base member and two essentially oppositely facing leg members extending from opposite ends of the base member. The leg members can be forced apart such that the device and sink can be placed therebetween in a predetermined configuration. When the legs resume their original position, the legs press against the sink and device sandwiched therebetween with sufficient force to maintain the sink and device in the predetermined configuration. Thus, a single piece clip can be used to secure a device and a sink together. Preferably the clip is formed of stainless steel.

The invention also includes a "power structure" assembly consisting of an inventive clip, heat sinks and the power devices required to configure an inverter/converter for rectifying AC voltage and converting DC to AC voltage. To this end, the brick includes a clip securing together six semiconductor switching devices, a SIP configured to rectify AC voltage, at least one heat sink and at least one thermally conductive and electrically insulating insulator. Preferably the sink includes first and second sinks, the insulator includes first, second and third insulators and the brick further includes a spacer.

In this case, the first insulator can be sandwiched between a first device pair and a first sink first surface, the second insulator can be sandwiched between a second device pair and a first sink second surface opposite the first sink first surface, the SIP can be placed against a second sink second surface, the third insulator can be sandwiched between a third device pair and a second sink first surface opposite the second sink second surface and the spacer can be sandwiched between the second and third device pairs. The first leg member contacts the second surfaces of the first device pair while the second leg member contacts a SIP second surface opposite the SIP first surface, with sufficient force to maintain all of the components therebetween in the predetermined configuration.

Thus, a primary object of the invention is to provide a simple, inexpensive and easy to assemble mechanism for attaching a semiconductor device to a heat sink. To these ends, the inventive clip includes only three resilient and integrally connected members which can be forced from a rest configuration into a configuration wherein a device and heat sink can be sandwiched therebetween. No screws or bolts are required. No apertures need be formed in the device or sink.

Another object of the invention is to provide a single clip of the above kind which can be used to secure more than one semiconductor device to one or more heat sinks. To this end the inventive clip can be used to sandwich several devices and one or more sinks between the leg members.

Yet another object of the invention is to provide all of the power components required to configure an inverter/converter in a single compact module referred to herein as a "power structure". To this end, all of the power components and required heat sinks and insulators can be positioned such that the boundaries between adjacent components are perpendicular to pressure provided via the leg members. In this manner, all of the components can be sandwiched between the leg members and held in desired positions.

In one aspect the base member includes anterior and posterior edges, the first leg member includes at least first anterior and first posterior leg members extending from the first end adjacent the anterior and posterior edges, respectively, and the second leg member includes at least second anterior and second posterior leg members extending from the second end adjacent the anterior and posterior edges, respectively.

One other object of the invention is to provide pressure on all of the semiconductor devices in the power structure despite the fact that some of the devices might be positioned next to each other. To this end, the anterior and posterior legs cooperate to independently provide pressure across the power structure. When a section of the power structure components aligned with the anterior legs defines a distance smaller than a section aligned with the posterior legs, the anterior legs contract more than the posterior legs and both sets of legs are functional to maintain brick components therebetween.

In another aspect the leg members extend from a first side of the base member and the base member is pre-bowed such that, prior to positioning the semiconductor and sink components between the leg members, the base member is concave toward the first side. In addition, prior to positioning components between the leg members, the base member is concave to a first degree and, after the components are positioned between the leg members, the base member is concave to a second relatively reduced degree such that the base member is essentially flat.

One other object of the invention is to provide a clip of the above kind wherein, after components are secured together via the clip, the clip itself requires minimal space. To this end, the inventive clip is pre-bowed so that, when stretched to accommodate components therebetween, the base member becomes essentially flat requiring very little additional space.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefor, to the claims herein for interpreting the scope of the invention.

DETAILED DESCRIPTION OF THE INVENTION

A. Hardware

Figure 1:
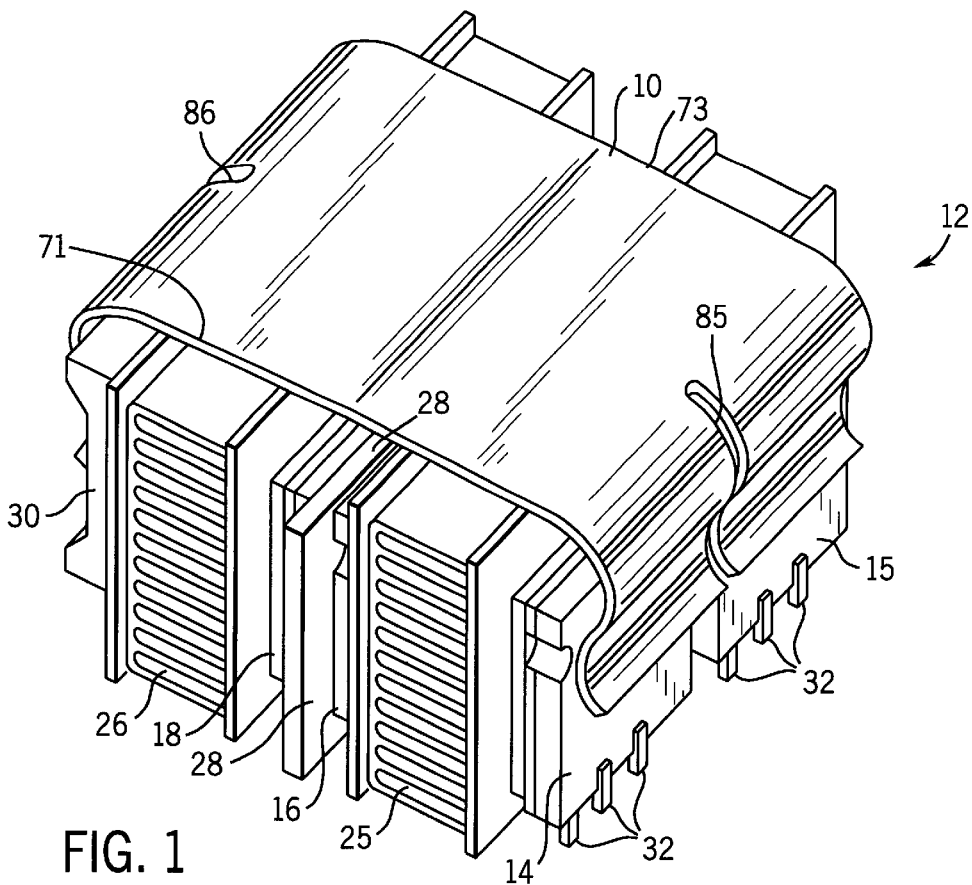
FIG. 1 is a perspective view of an inventive spring clip securing together the power components of an inverter/converter.

Referring now to the drawings, wherein like reference characters represent corresponding elements throughout the several views, and more specifically referring to FIG. 1, an inventive spring clip 10 is shown which holds various semiconductor switching devices and a single inline integrated circuit package (SIP) in thermal contact with heat radiating sinks. In the description which follows, the switching devices and the SIP constitute the power section of an inverter/converter and, in order to simplify this explanation, the entire assembly illustrated in FIG. 1 will be referred to as a "power structure" 12.

Figure 2:
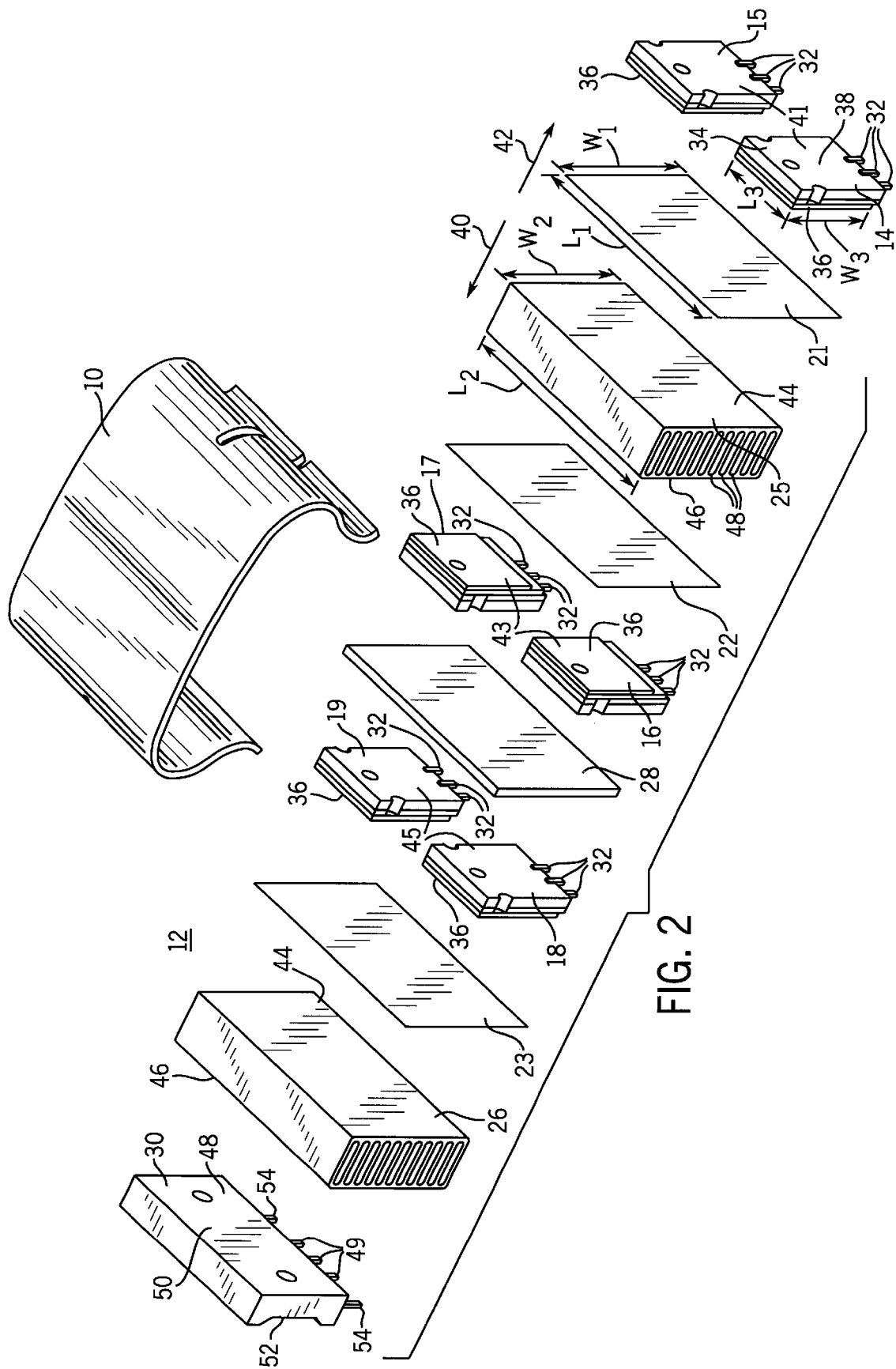
FIG. 2 is a is an exploded view of the of FIG. 1.
Figure 3:
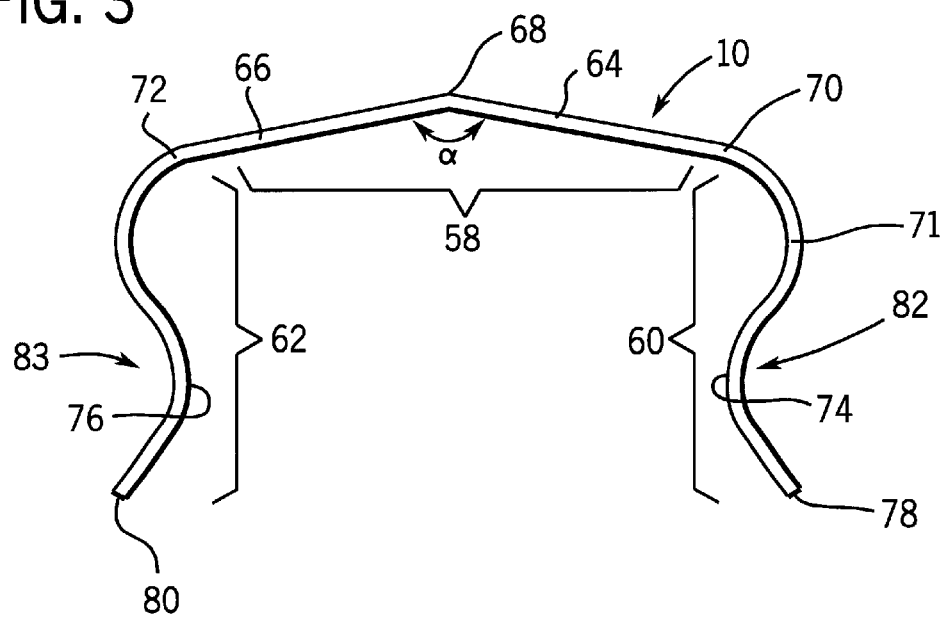
FIG. 3 is a side elevational view of the clip of FIG. 1.

Referring also to FIG. 2, power structure 12 includes first, second, third, fourth, fifth and sixth semiconductor switching devices 14, 15, 16, 17, 18 and 19, respectively, first, second and third thermally conductive and electrically insulative insulators, 21, 22 and 23, respectively, first and second heat sinks 25 and 26, respectively, a single spacer member 28, SIP 30 and clip 10.

Figure 4:
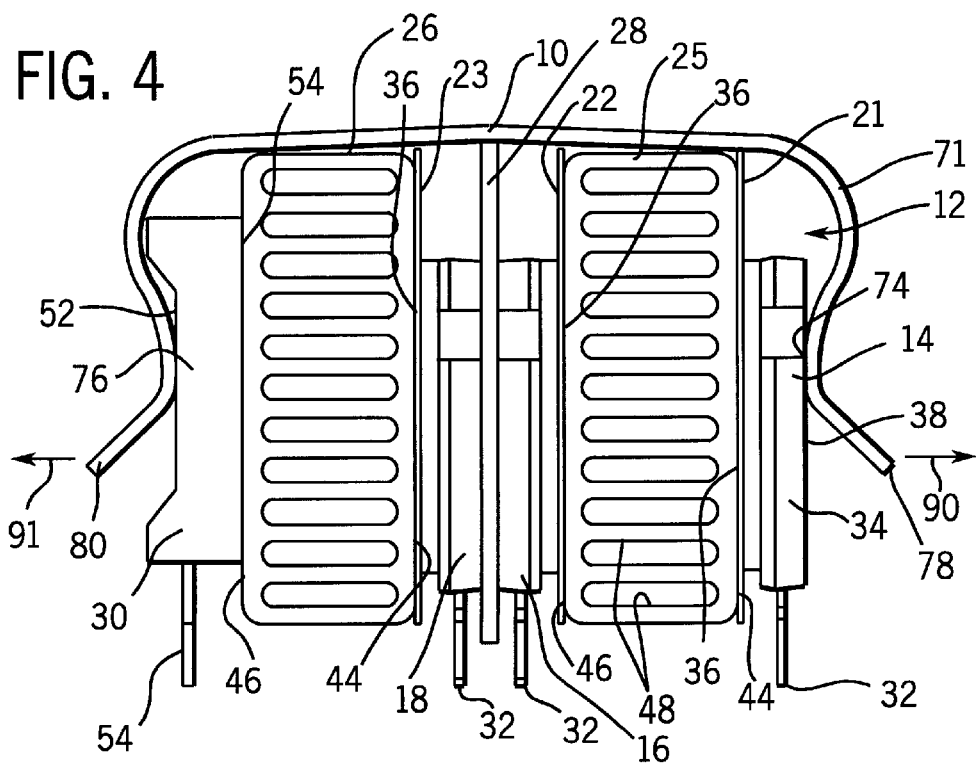
FIG. 4 is a side elevational view of the assembly of FIG. 1.

Referring to FIGS. 2 and 4, switching devices 14, 15, 16, 17, 18 and 19 are preferably high power transistors (e.g. IGBT's). These types of transistors are well known in the art and therefore will not be explained here in detail. In addition, to the extent that devices 14 through 19 will be explained, all of the devices are identical and therefore, only device 14 will be described. Device 14 includes a body section 34 including a clip housed in a resin housing and three electrical leads (i.e. a gate, a collector and an emitter) collectively referred to by numeral 32 which extend downwardly from section 34. Section 34 is a flat member and includes first and second essentially parallel and oppositely facing surfaces 36, 38, respectively, and has a width dimension $W_3$ in a direction parallel to leads 32 and a length dimension $L_3$ perpendicular to dimension $W_3$. Surface 36 is metallic and forms a primary heat dissipating surface.

Electrical leads extending from devices 15, 16, 17, 18 and 19 are also collectively referred by numeral 32 while the first or primary heat dissipating surfaces are collectively referred to by numeral 36. As will become apparent below, first surfaces 36 of devices 14, 15, 18 and 19 face in a first direction indicated by a first arrow 40 while first surfaces 36 of devices 16 and 17 face the opposite direction indicated by arrow 42. In addition, for the purposes of this explanation, devices 14 and 15 will be referred to as a first devices pair 41, devices 16 and 17 will be referred to as a second device pair 43 and devices 18 and 19 will be referred to as a third device pair 45. In addition, devices 14, 16 and 18 will be referred to as anterior devices while devices 15, 17 and 19 are referred to as posterior devices.

Insulators 21, 22 and 23 are essentially identical and therefore, only insulator 21 will be explained here in detail. Insulator 21 has width $W_1$ and length $L_1$ dimensions which are equal to or slightly larger than similar dimensions $W_2$ and $L_2$ of an adjacent heat sink 25 surface 44. Insulator 21 is formed of a material that is electrically insulating, heat-conducting and mechanically isolating and can be a silicon-based or epoxy-based composition. Preferred materials for insulator 21 include the material commercially available and sold under the registered trademark KAPTON (from by E. I. DuPont de Nemours, Wilmington, Del.) and the material commercially available under the trademark SILPAD (from Bergquist Company).

First and second heat sinks 25 and 26 are essentially identical and therefore, only sink 25 will be explained here in detail. Sink 25 includes a block of extruded thermally conductive material (e.g. aluminum, copper) having first and second essentially parallel and oppositely facing surfaces 44 and 46, respectively. The dimensions of each surface 44 and 46 are identical being width $W_2$ and length $L_2$. A third sink dimension is depth $D_2$ between surfaces 44 and 46. Sink 25 forms a plurality of elongated slots collectively referred to by numeral 48 which extend along entire length $L_2$. Slots 48 increase the sink surface area which is exposed to the ambient air or forced air and thereby increase heat dissipation. Width $W_2$ should be approximately one and one-half times the width dimension $W_3$ of first surface 36. Length $L_2$ should be approximately three times the length dimension $L_3$ of first surface 36. These dimensions allow sufficient spacing between switch pairs 14 and 15 and sufficient heat dissipation when power structure 12 is assembled (see FIG. 1).

Spacer 28 has essentially the same width and length dimensions (not illustrated) as insulator 21 (i.e. the width and length dimensions are $W_1$ and $L_1$, respectively) but is slightly thicker than insulator 21. Spacer 28 is preferably formed of a polycarbonate material.

SIP 30 includes a body section 48, three input leads collectively referred to by numeral 49 and two output leads collectively referred to by numeral 54, leads 49 and 54 extending from body 48 in a single line. As well known in the controls art, body 48 includes a six diode bridge for rectifying three-phase AC input voltage provided to leads 49, providing DC output voltage on output leads 54 (i.e. leads 54 constitute positive and negative DC buses). Body 48 is essentially a flat member including first and second essentially parallel and oppositely facing surfaces 50 and 52. First surface 50 is a primary heat dissipating surface.

Referring now to FIGS. 2 through 6, clip 10 generally includes a base member 58 and first and second leg members 60 and 62. Base member 58 includes first and second essentially flat lateral members 64, 66, respectively which are connected by an elbow section 68. Member 58 has first and second ends 70, 72, respectively, and anterior and posterior edges 71, 73, respectively. Prior to assembling brick 12, section 68 forms an arc a such that member 58 is concave in the direction that leg members 60 and 62 extend (see FIG. 3).

Members 60 and 62 are resilient, extend from first and second ends 70, 72, are oppositely facing and each terminates at a distal end 78, 80, respectively. Adjacent distal ends 78 and 80, each member 60, 62 includes a bowed section 82, 83, respectively which curves inwardly toward the other leg member forming facing contact surfaces 74, 76, respectively.

Figure 5:
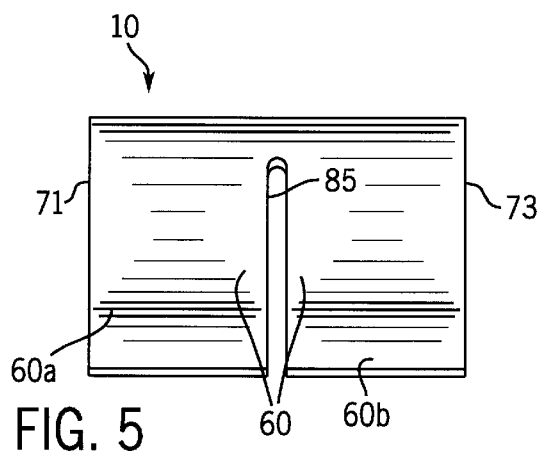
FIG. 5 is and end elevational view of the clip of FIG. 1.
Figure 6:
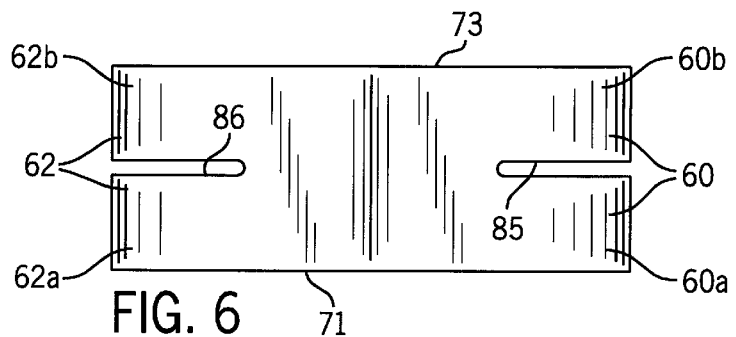
FIG. 6 is a top elevational view of the clip of FIG. 1.

Referring to FIGS. 2, 5 and 6, each leg member 60, 62 is bifurcated such that each member forms separate anterior and posterior legs. The anterior legs are identified by numerals 60a and 62a and are adjacent anterior edge 71 while the posterior legs are identified by numerals 60b and 62b and are adjacent posterior edge 73. Leg slits 85 and 86 define adjacent edges of anterior and posterior legs.

Clip 10 is preferably formed of resilient non-corrosive material such as stainless steel.

B. Assembly of Hardware

To assembly power structure 12, referring to FIG. 2, first insulator 21 is placed on first sink first surface 44 and first device pair 41 is placed with first surfaces 36 against insulator 21 (i.e. insulator 21 is between surfaces 44 and 36) with leads 32 aligned in a single plane and extending downwardly below a lower edge of sink 25 (see FIG. 4). Next, second device pair 43 and second insulator 22 are similarly arranged on first sink second surface 46. To this end, second insulator 22 is positioned between the first surfaces 36 of devices 16 and 17 and surface 46 with devices 16 and 17 arranged next to each other and spaced apart and leads 32 aligned in a single plane and extending downwardly below a lower edge of sink 25.

Referring still to FIG. 2, SIP 30 is placed in direct contact with a second side 46 of second sink 26 with leads 49 and 54 aligned and extending downwardly therefrom below sink 26. Third insulator 23 is arranged between switching devices 18 and 19 and second sink 26 first surface 44, with devices 18 and 19 next to each other and spaced apart and leads 32 therefrom arranged in a single plane (see FIG. 4). Spacer 28 is arranged between device pairs 43 and 45. At this point, the power structure 12 components appear as illustrated in FIG. 4 except that clip 10 is not secured therearound.

Referring still to FIG. 4, importantly, when brick components are configured, insulators 21, 22 and 23 should each extend down below the body sections 34 of adjacent devices 14 thorough 19 to minimize voltage creep. In addition, insulators 21, 22 and 23 should extend laterally of adjacent devices for the same purpose (see FIG. 1). Moreover, all devices and SIP electrical leads 54, 32 (and 49, not illustrated in FIG. 4) should extend below sinks 25, 26, spacer 28 and insulators 21, 22 and 23 so that connection to a circuit board is unimpeded.

To secure brick components together, a machine is used to grasp and force distal ends 78, 80 apart in the directions indicated by arrows 90 and 91. When sufficiently apart, elbow section 68 deforms substantially and, as can be seen in FIG. 4, becomes essentially flat (i.e. lateral sections 64 and 66 become essentially co-planar).

With ends 78 and 80 forced outwardly, brick components are placed between contact surfaces 74 and 76 and ends 78 and 80 are allowed to move back toward their original positions. Contact surface 74 contacts second surfaces 38 of first device pair 41 while contact surface 76 contacts SIP second surface 52. The force generated by clip 10 is sufficient to grasp and hold together all components of the power structure 12 in the configuration illustrated. When power structure 12 is completely assembled, as best seen by comparing FIGS. 3 and 4, pre-bowed arc $\alpha$ is essentially 180° thereby insuring a reduced overall height of power structure 12. In other words, prior to forcing ends 78 and 80 apart, arc $\alpha$ is of a first degree and after clip 10 is forced around brick components, while there may be some bow left at elbow section 68, the bow will be extremely small and certainly of a degree less than the unstressed arc $\alpha$.

It should be understood that the methods and apparatuses described above are only exemplary and do not limit the scope of the invention, and that various modifications could be made by those skilled in the art that would fall under the scope of the invention. For example, while the preferred clip is formed of stainless steel, clearly, other materials (e.g. resilient plastic or other metallic materials) could be used to form the clip. In addition, while the clip is illustrated as having both anterior and posterior legs, clearly, the clip could be provided with a single leg extending from each of the first and second ends of the base member. Moreover, more than two legs could be provided extending from each of the first and second ends of the base member. Furthermore, while the clip is illustrated in the context of securing all of the power components required to configure an inverter/converter, clearly the clip could be used to secure fewer or greater numbers of semiconductor devices to heat sinks. For example, a reduced sized clip could be used to secure a single semiconductor switching device to a suitable heat sink.

In addition, the order of power structure components or the components themselves could be altered. For example SIP 30 and switching devices 18 and 19 could be switched or all of devices 14 through 19 and SIP could be sandwiched to a single, albeit larger, sink. Moreover, sinks 25 and 26 can be formed in any manner well known in the art.

To apprise the public of the scope of this invention, we make the following claims:

What is claimed is:

1. An electronic device/heat sink assembly comprising:
   an assembly including:
   at least first and second heat generating electronic devices, each of the first and second devices having essentially parallel and oppositely facing first and second surfaces;
   a heat sink member having essentially parallel and oppositely facing first and second surfaces, the heat sink member first surface in thermal contact with the first device first surface, the second surface of the sink in thermal contact with the first surface of the second device, the second surface of the first device and the second surface of the second device essentially parallel;
   a resilient spring clip including a base member having first and second ends, first and second essentially oppositely facing resilient leg members extending from the first and second ends of the base member, respectively, each leg member forming a contact surface adjacent a distal end which faces the opposite leg member, the assembly positioned between the first and second leg members such that the contact surfaces apply pressure against the second surfaces of the first and second devices maintaining the first and second devices and the heat sink member in an assembled configuration wherein the first and second leg members extend from a first side of the base member and the base member is pre-bowed such that, prior to positioning the assembly between the first and second leg members, the base member is concave toward the first side of the base member.

2. The assembly of claim 1 wherein the assembly further includes at least a first thermally conductive and electrically insulating insulator positioned between the first surface of the first device and the first surface of the heat sink member.

3. The assembly of claim 2 further including at least a second thermally conductive and electrically insulating insulator positioned between the first surface of the second device and the second surface of the heat sink member.

4. The assembly of claim 1 wherein each of the first and second leg members forms a bowed section adjacent a distal end which extends inwardly toward the other leg member, each bowed section forming one of the contact surfaces.

5. The assembly of claim 1 wherein the base member includes anterior and posterior edges, the first and second leg members are a first anterior leg member and a second anterior leg member extending from the first and second ends of the base member adjacent the anterior edge, respectively, and the clip further includes a first posterior leg member and a second posterior leg member extending from the first and second ends of the base member adjacent the posterior edge, respectively.

6. The assembly of claim 1 wherein, prior to positioning the assembly between the leg first and second members of the clip, the base member is concave to a first degree and, when the assembly is positioned between the leg members, the base member is concave to a second relatively reduced degree.

7. The assembly of claim 6 wherein, when the assembly is positioned between the first and second leg members, the base member is essentially flat.

8. The assembly of claim 1 wherein the heat generating devices are semiconductor switching devices.

9. The assembly of claim 8 further including at least a third semiconductor switching device having first and second oppositely facing surfaces, the first surface of the third device being a primary heat dissipating surface, the first surface of the third device sandwiched between the first surface of the heat sink member and the first leg member of the clip.

10. The assembly of claim 9 further including fourth, fifth and sixth semiconductor switching devices, each device including first and second surfaces, each device first surfaces being a primary heat dissipating surfaces, each of the fourth, fifth and sixth device secured by pressure between the first and second leg members of the clip such that each first surface of the fourth, fifth and sixth devices is in thermal contact with one of the first and second surfaces of the heat sink member.

11. The assembly of claim 10 further including at least a second heat sink member having first and second oppositely facing surfaces, the second heat sink member also sandwiched between the first and second leg members of the clip such that at least one device first surface is in thermal contact with each of the first and second surfaces of the second heat sink member.

12. The apparatus of claim 11 wherein the second sink member is positioned between the first sink member and one of the first and second leg members.

13. The assembly of claim 11 further including an integrated circuit package comprising an AC to DC voltage rectifier, the package having first and second essentially parallel oppositely facing surfaces, first surface of the package being a primary heat dissipating surface, the package sandwiched between the first and second leg members of the clip such that the first surface of the package is in thermal contact with at least one of the first and second surfaces of the first sink and the first and second surfaces of the second sink.

14. The assembly of claim 13 wherein the base member includes anterior and posterior edges, the first and second leg members are a first anterior leg member and a second anterior leg member extending from the first and second ends of the base member adjacent the anterior edge of the base member, respectively, and the clip further includes a first posterior leg member and a second posterior leg member extending from the first and second ends of the base member adjacent the posterior edge of the base member, respectively.

15. The apparatus of claim 1 wherein the heat sink member includes first and second heat sink members and the apparatus further includes at least a third heat generating device, the third device positioned between the first and second heat sink members and in thermal contact with at least one of the heat sink members.

* * * * *